US007598005B2

(12) United States Patent
Yamamoto

(10) Patent No.: US 7,598,005 B2

(45) Date of Patent: Oct. 6, 2009

(54) PHOTOMASK AND MANUFACTURING METHOD OF THE SAME, AND PATTERN FORMING METHOD

(75) Inventor: Tomohiko Yamamoto, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 490 days.

(21) Appl. No.: 11/128,183

(22) Filed: May 13, 2005

(65) Prior Publication Data

US 2005/0208392 A1 Sep. 22, 2005

Related U.S. Application Data

(63) Continuation of application No. PCT/JP03/002286, filed on Feb. 28, 2003.

(51) Int. Cl.
*G03F 1/00* (2006.01)
*G06F 17/50* (2006.01)

(52) U.S. Cl. ................................ 430/5; 716/19; 716/20

(58) Field of Classification Search ..................... 430/5, 430/4; 716/19–21; 378/34, 35; 700/97–98, 700/119–121

See application file for complete search history.

(56) References Cited

U.S. PATENT DOCUMENTS

2003/0008215 A1 * 1/2003 Mukherjee ..................... 430/5

FOREIGN PATENT DOCUMENTS

| | | | |
|---|---|---|---|
| JP | 2-1848 | | 1/1990 |
| JP | 3-185444 | | 8/1991 |
| JP | 4-67613 | | 3/1992 |
| JP | 04-067613 | A | 3/1992 |
| JP | 4-151661 | | 5/1992 |
| JP | 2000-066366 | A | 3/2000 |

OTHER PUBLICATIONS

Patent Abstracts of Japan, Publication No. 60136225 A, published on Jul. 19, 1985.

Korean Office Action mailed on May 29, 2006 of Japanese Patent Application of 04-067613.

Japanese Office Action dated Mar. 24, 2009 (mailing date), issued in corresponding Japanese Patent Application No. 2004-568760 with its partial English language translation.

* cited by examiner

*Primary Examiner*—Mark F Huff
*Assistant Examiner*—Jonathan Jelsma
(74) *Attorney, Agent, or Firm*—Westerman, Hattori, Daniels & Adrian, LLP.

(57) ABSTRACT

Data (pattern data) (21) of a mask data (2) to form a mask pattern is made into an octagon. An electron-beam lithography system has a high resolution, and it requires a polygonal pattern data having many more vertexes such as an octagon. With the use of such a pattern data, a photomask (3) having a mask pattern (22) being an aperture closer to a circle (approximated circle) can be obtained. Backed by this, it is possible to form resist patterns at smaller pitches without causing failures in manufacturing a device such as a reduction in resist film thickness, a disconnection between actual patterns such as of contact holes, and so forth. Further, it is possible to eliminate the factor of mask manufacturing process from the optical proximity correction to simplify the optical proximity correction, so that desired macro actual patterns can be formed easily and accurately.

9 Claims, 13 Drawing Sheets

27
8
28
28

PHOTOMASK AND MANUFACTURING METHOD OF THE SAME, AND PATTERN FORMING METHOD

This application is a continuation of international application PCT/JP03/02286 filed on Feb. 28, 2003.

TECHNICAL FIELD

The present invention relates to a photomask used to manufacture a semiconductor device, a liquid crystal, and so forth and a manufacturing method of the same, and a pattern forming method.

BACKGROUND ART

Along with the advance in the integration of semiconductor elements, the patterns formed by lithography systems are making progress in microfabrication. In the progress, however, it is considered to be difficult to form contact holes arranged at smaller pitches. In order to form the contact holes at smaller pitches by conventional technologies, there is used a technique in which a square mask pattern is formed by biasing a mask data or design data and the mask is transferred onto a wafer. For instance, in order to form contact holes arranged at pitches of 240 nm and each having a diameter of 120 nm by an ArF aligner under the illumination conditions of numeral aperture (NA)=0.7 and $\sigma$=0.7, the patterns on the mask come to be a square pattern each having a diameter of 160 nm, which requires a bias of approximately 40 nm to be stably formed.

This technique allows the contact holes to be formed, however, it increases the light intensity at a light shielding part to sometimes cause a failure such as a reduction in resist film thickness or disconnection.

Further, when fabricating a mask, a mask is normally biased in consideration of the influence of optical proximity effect (OPC: Optical Proximity Correction). The correction value for the bias should consider the influence of the optical proximity effect, the influence of etching proximity effect, the influence of pattern shapes in the mask manufacturing processes, and the like. At this time, a difference caused in the mask manufacturing processes leads to a change in the optical proximity correction value. That is, every change in the mask manufacturing processes requires a recalculation of an optimal value for the optical proximity correction, complicating the optical proximity correction and requiring a huge range of steps in addition thereto.

Therefore, an object of the present invention is to provide a photomask capable of forming desired micro actual patterns easily and accurately by forming a resist pattern without causing a failure in manufacturing a device such as a reduction in resist film thickness, a disconnection between actual patterns such as contact holes, or so forth even if the patterns are arranged at small pitches, and by simplifying an optical proximity correction by way of eliminating the factor of the mask manufacturing processes from the optical proximity correction; and a manufacturing method of the same; and a pattern forming method.

SUMMARY OF THE INVENTION

A manufacturing method of a photomask according to the present invention is the manufacturing method of such a photomask that is provided with a mask pattern, in which the mask pattern is a mask pattern to form an actual pattern of an outline including at least partly a curve, and in which the mask pattern is formed such that an outline part of the mask pattern corresponding to the curve of the actual pattern approximates to the curve using polygonal line segments enabling to approximate the outline part of the mask pattern to the curve.

The photomask according to the present invention is a photomask provided with a mask pattern, in which the mask pattern is one mask pattern to form an actual pattern of an outline including at least partly a curve, and in which the mask pattern is formed such that an outline part of the mask pattern corresponding to the curve of the actual pattern approximates to the curve.

The formation method of a pattern according to the present invention is a formation method of an actual pattern of an outline including at least partly a curve, in which the actual pattern is formed by using a photomask provided with a mask pattern with an outline part of the mask pattern corresponding to the curve of the actual pattern being approximated to the curve, and by espousing and transferring the mask pattern.

The formation method of a pattern according to the present invention is a formation method of an actual pattern of an outline including at least partly a curve, in which the mask pattern is formed to approximate to the circular shape or the oval shape so as to correspond to the shape of the actual pattern.

Here, when the actual pattern is of a circular shape or an oval shape, then the mask pattern is formed to approximate to the circular shape or the oval shape to correspond thereto.

Further, when the actual pattern has an outline with curbed corners, then the mask pattern has an outline with curved corners approximated to the curved corners of the actual pattern to correspond thereto.

DETAILED DESCRIPTION OF THE PREFERRED EMBODIMENTS

The previously-described problems, specifically, the reduction in a resist film thickness and a disconnection caused when forming an actual pattern, and the optimal optical proximity corrections required depending on each of the mask manufacturing processes come to obvious when forming the actual pattern having a circular or oval outline such as a contact hole. When reviewing this from a general view point, the problems can be deemed to be attributable to the requirement that, when forming a micro actual pattern having an outline including at least partly a curve, such a part of the mask pattern that corresponds to the curve of the actual pattern be formed to approximate to the curve using a plurality of line segments (polygonal line segments).

The present inventor has conceived that the above-described problems can be prevented by the use of a photomask having an approximated curve to the curve of the actual pattern, in other words, by approximating such a part of the mask pattern that corresponds to the curve of the actual pattern thereto by way of the above-described approximation using polygonal line segments (polygonal approximation) beforehand in the step of a mask data to form a mask pattern of the photomask (depending on cases, however, the polygonal approximation employs for example a hexagon, octagon, or a polygon having more vertexes when forming an actual pattern of a circular shape). That is, the polygonal approximation for approximating the outline of a mask pattern to a curve is a technique capable of approximating such a part of the mask pattern that corresponds to the curve of an actual pattern to the curve, and differs depending on the modes of mask pattern drawing, various conditions, and so forth in addition to the shape of the mask pattern. Accordingly, a desired mask pattern can be formed based on an individual and specific polygonal approximation in accordance with the shapes, the conditions, or so forth.

It should be noted that, as an electron-beam aligner to draw a circular pattern, there is disclosed one in Japanese Patent Application Laid-Open No. Sho60-136225 that draws the circular pattern based on information on a center position and radius. However, as a background of the present invention, it is extremely difficult to form a micro pattern of recent-days by such a simple technique, so that the present invention has been made to practically respond to the demands to form a desired micro pattern. Specifically, in order to practically form a micro actual pattern of a circular shape, as in the present invention, an approximated pattern that matches with the shape to form, the mode of mask pattern drawing, the various conditions, and so forth is necessary to be formed, and in this case, a mask pattern approximated to a circle is necessary to be formed.

Hereinafter, specific grounds for the above-described technical idea will be described in detail.

Figures 1A, 1B:
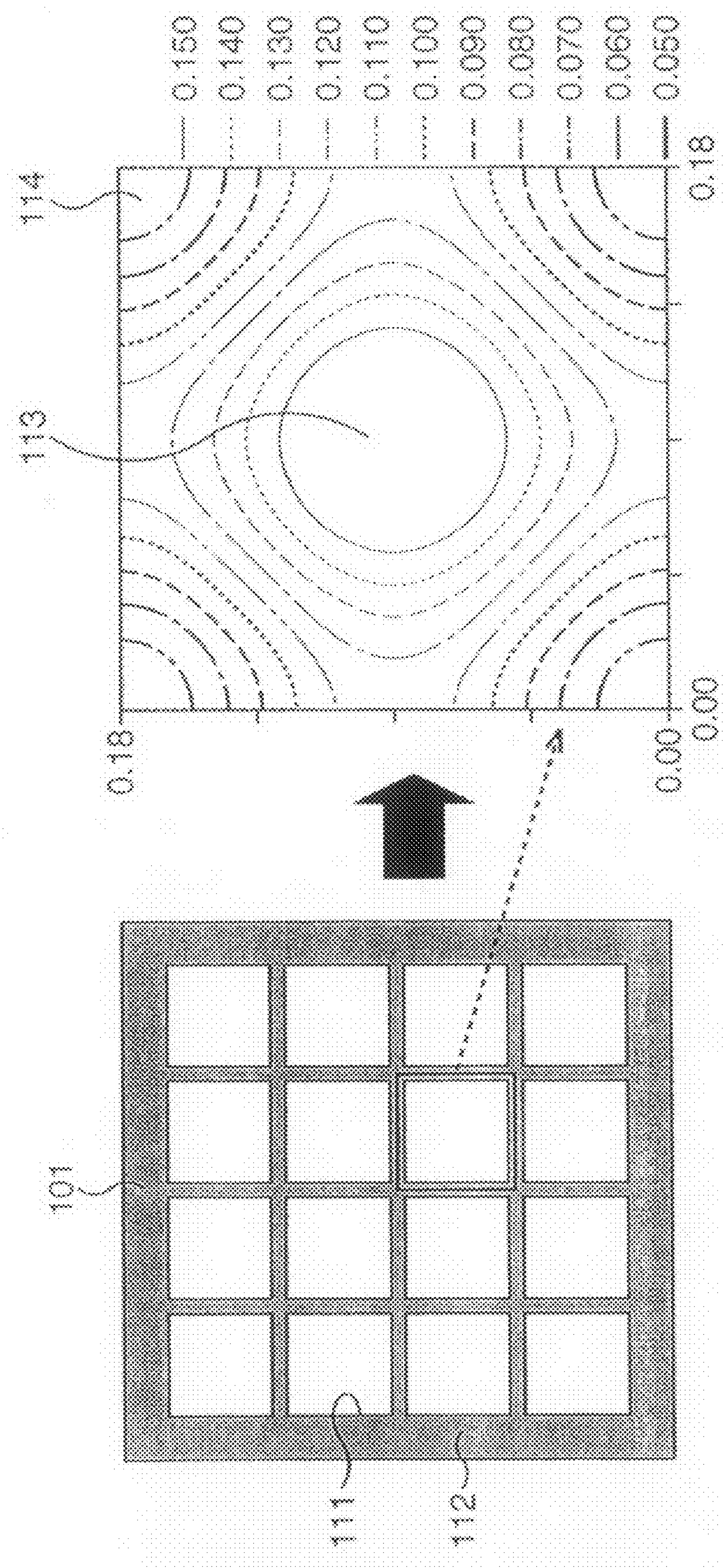
FIG. 1A is a schematic plan view showing a mask image when forming a conventional contact hole.
FIG. 1B is a contour map of a light intensity derived from a simulation of the mask image in FIG. 1A.

FIGS. 1A, 1B, 2A, 2B, 3 are views to illustrate a principle of the present invention. FIG. 1A is a schematic plan view showing a mask image for forming a conventional contact hole, and FIG. 1B is a contour map showing light intensities derived from a simulation thereof.

Respective mask patterns 111 of a photomask 101 are apertures to form contact holes and arranged at pitches of 180 nm, in which each of them is designed into a square of a side of 130 nm. The illumination condition is NA=0.7 and σ=⅔ zone. A light shielding part is denoted by "112" and corresponds to the part of the wafer to have a resist remained.

In FIG. 1B, out of the light intensities obtained from the simulation, the point receiving the maximum light intensity is denoted by "113" and the point receiving the minimum light intensity is denoted by "114" . . . . From the result, however, it is found that the light intensity received by the point 113 increases while the light intensity received by the point 114 also increases, indicating that the light intensity contrast falls on the whole.

Figures 2A, 2B:
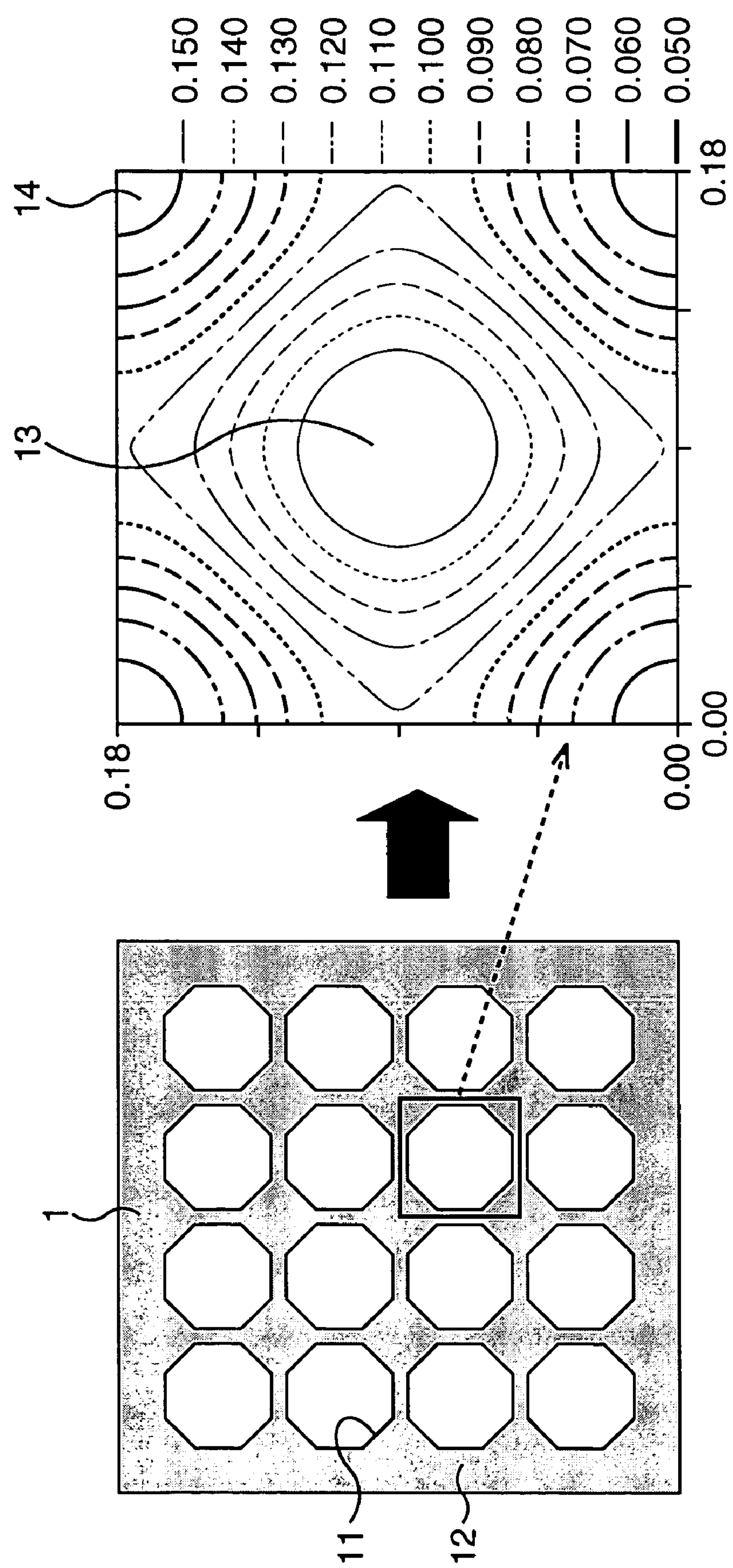
FIG. 2A a schematic plan view showing a mask image when a mask pattern is formed into a polygon having more vertexes by the present invention.
FIG. 2B is a contour map of a light intensity derived from a simulation of the mask image in FIG. 2A.

FIG. 2A is a schematic plan view showing a mask image when a mask pattern of a polygonal shape having more vertexes is in use, and FIG. 2B is a contour map showing light intensities derived from the simulation thereof. Mask patterns 11 of a photo mask 1 are apertures for forming contact holes and arranged at pitches of 180 nm, each of which being designed into an octagonal shape with a diameter of 140 nm. The illumination condition is NA=0.7 and σ=⅔ zone. A light shielding part is denoted by "12" and corresponds to the part of the wafer to have a resist remained.

In FIG. 2B, out of the light intensities obtained from the simulation, the point receiving the maximum light intensity is denoted by "13" and the point receiving the minimum light intensity is denoted by "14". From comparison between this result and the result in FIG. 1, it is found that the light intensity at the point 13 slightly fell and the light intensity at the point 14 also fell, indicating that the light intensity contrast increase in FIG. 2B as compared to FIG. 1B.

Figure 3:
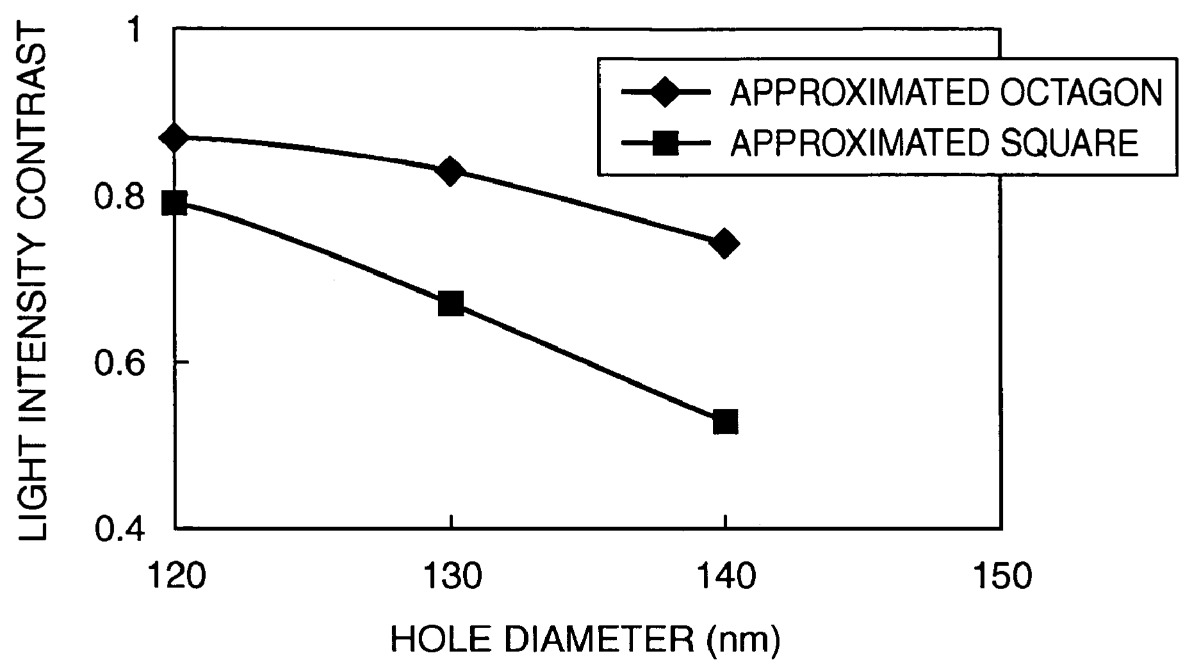
FIG. 3 is a characteristic chart showing a relation between a light intensity contrast and a hole diameter when mask patterns for forming contact holes are approximated to a square shape and a octagonal shape, respectively.

FIG. 3 is a characteristic chart showing a relation between a light intensity contrast and a hole diameter in the case where the mask pattern for forming a contact hole is approximated to a square and octagonal shapes.

The mask patterns are arranged at pitches of 180 nm, and the illumination conditions are NA=0.7 and σ=⅔ zone. The result shows that the contrast is larger when the mask pattern is approximated to a circle using an octagon as compared to the case using a square. Accordingly, the contact holes arranged at smaller pitches that the conventional techniques could not realize can be realized. Although this simulation result performs the approximation using an octagon, the approximation to the circle (outline has a curved line) is preferably performed using a polygon having more vertexes so as to approximate to the circle as much possible.

Further, when the mask pattern is formed into approximately a circular shape, it is possible to eliminate the parameter attributable to the mask from the optical proximity correction in that the difference in rounding of patterns caused by lithographic systems or manufacturing processes becomes invisible. Hence, even if the mask manufacturing process is changed, the optical proximity correction value is not necessarily changed, so that the number of manufacturing processes can be reduced.

Specific Embodiments of Present Invention

First Embodiment

Figure 4A:
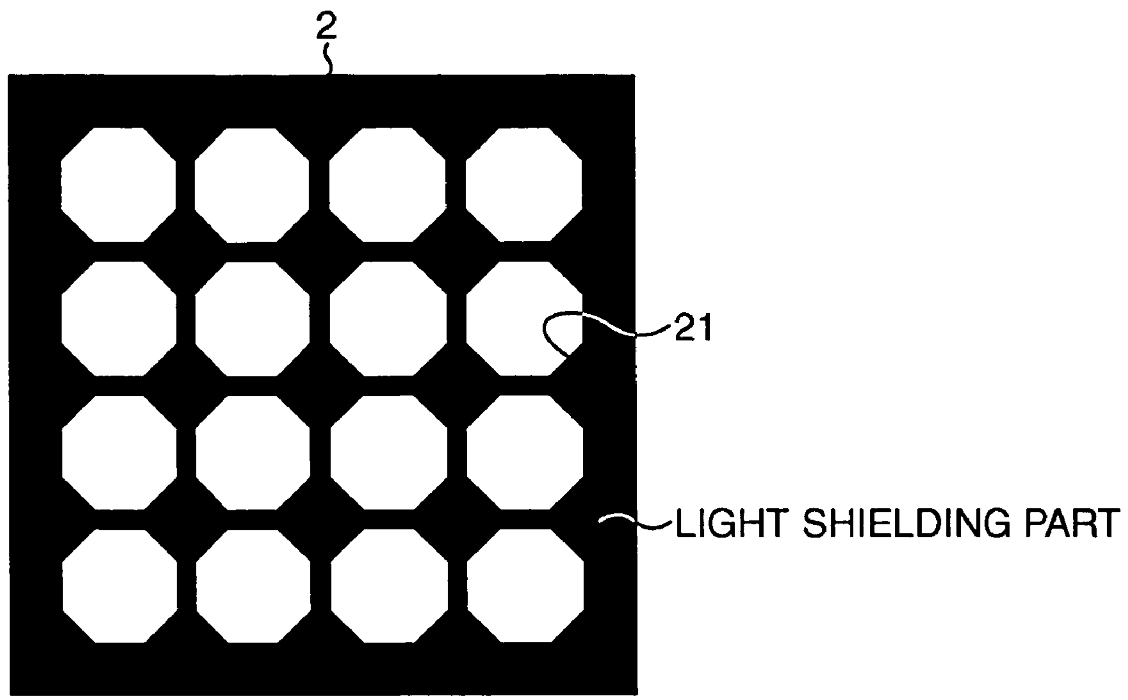
FIG. 4A is schematic plan view showing a data image when fabricating a photomask using an electron-beam lithography system.
Figure 4B:
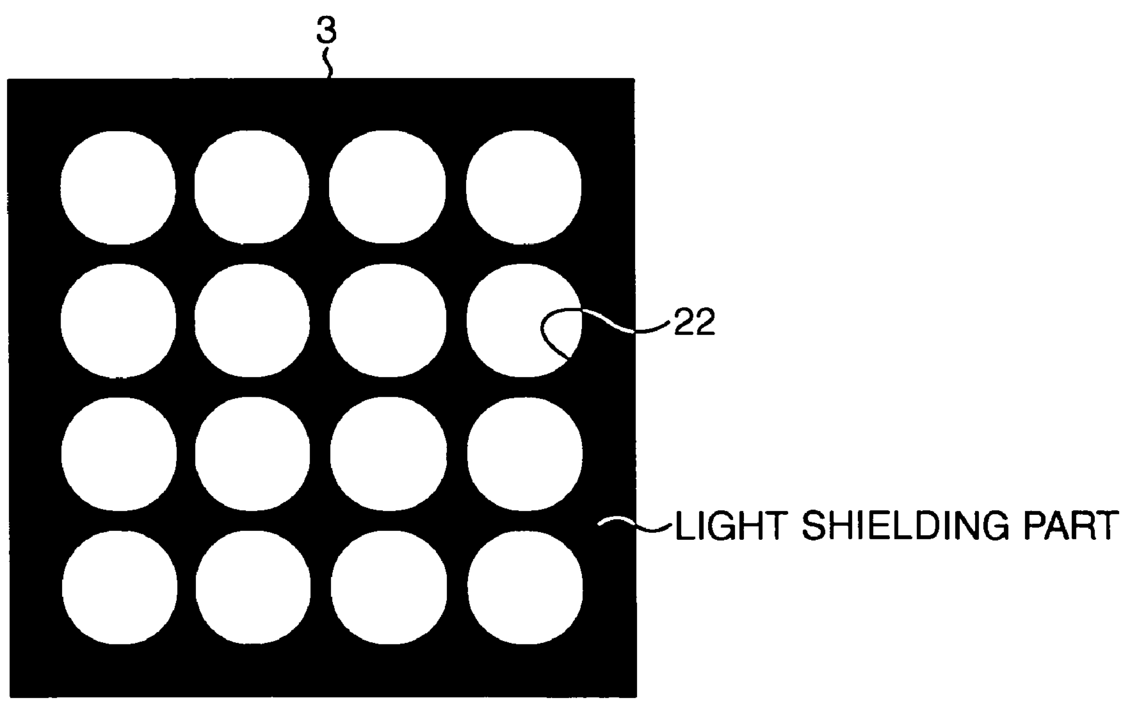
FIG. 4B is a schematic plan view showing a mask image fabricated using the mask data in FIG. 4A.

A first embodiment according to the present invention is shown in FIGS. 4A and 4B. In the first embodiment, a photomask is fabricated by forming a mask pattern using an electron-beam lithography system. FIG. 4A is a schematic plan view showing a data image for fabricating the photomask using the lithography system employing an electron beam, and FIG. 4B is a schematic plan view showing a mask image fabricated using the mask data.

In the data image, a data (pattern data) 21 of a mask data 2 for forming a mask pattern is formed into an octagonal shape. The electron-beam lithography system has a high resolution to thereby require a polygonal pattern data having more vertexes such as the octagon or the like. With the use of such a pattern data, a photomask 3 having a mask pattern 22 being an aperture closer to a circler shape (approximated circle) can be obtained.

Second Embodiment

Figure 5A:
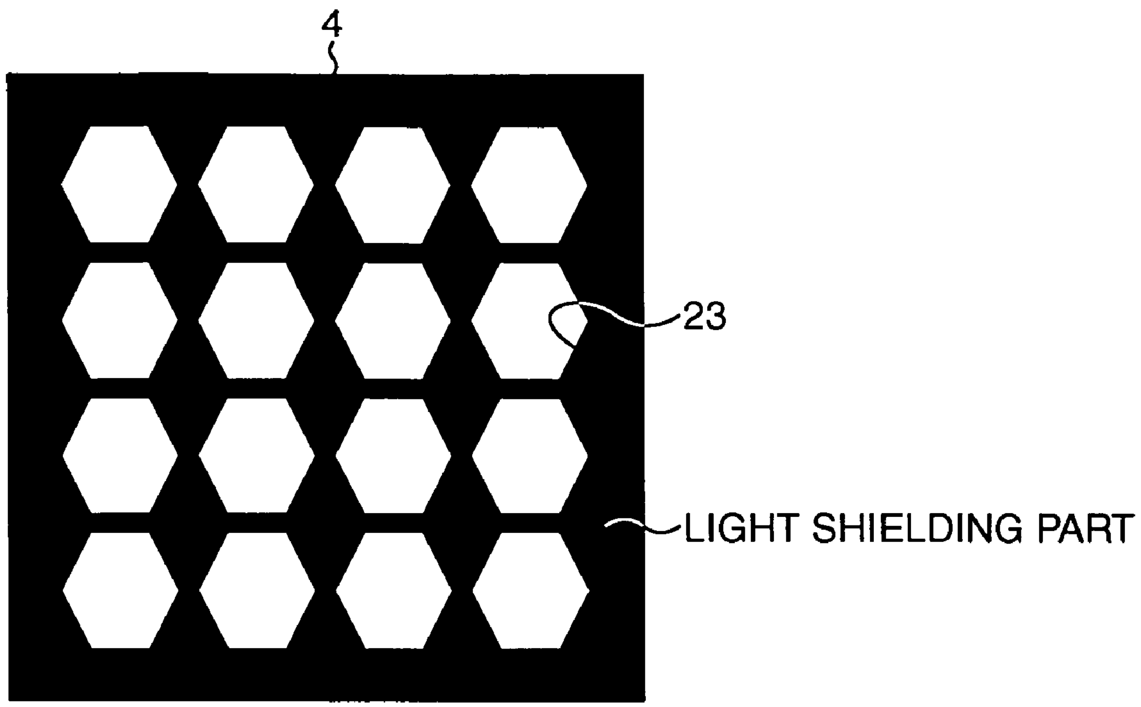
FIG. 5A is a schematic plan view showing a data image when fabricating a photomask using a laser-beam lithography system employing an i-line or so forth.
Figure 5B:
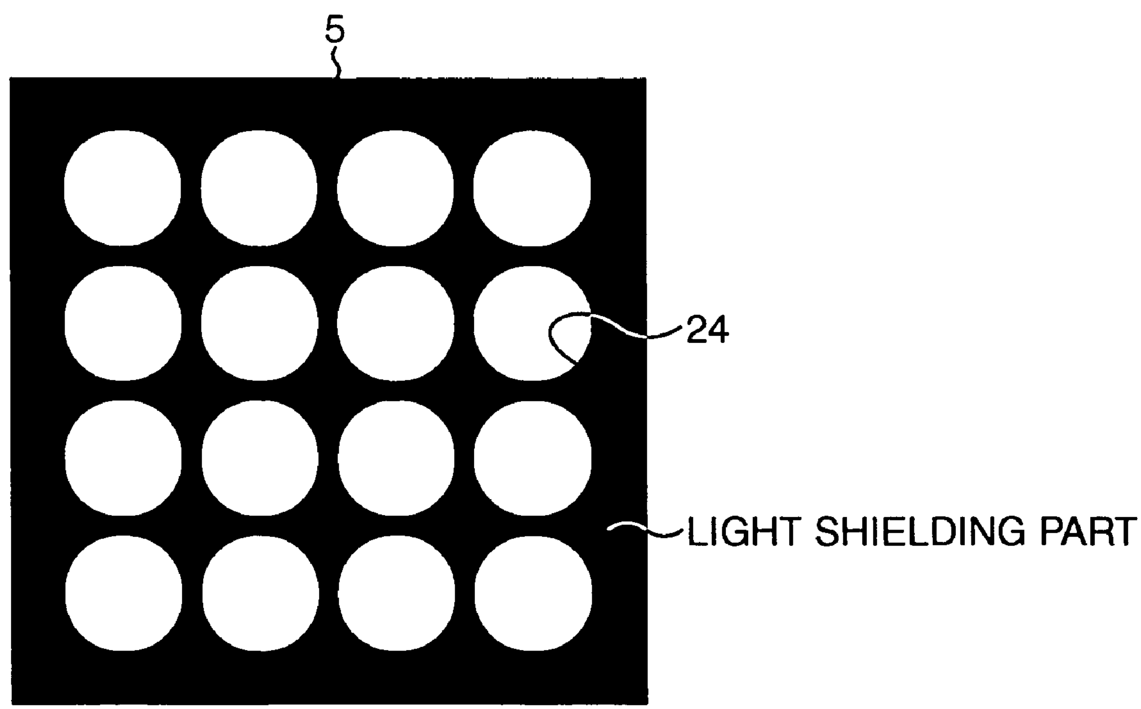
FIG. 5B is a schematic plan view showing a mask image of the mask fabricated using the mask data in FIG. 5A.

A second embodiment according to the present invention is shown in FIGS. 5A and 5B. In the second embodiment, a photomask is fabricated by forming a mask pattern using a laser-beam lithography system. FIG. 5A is a schematic plan view showing a data image for fabricating the photomask using the laser-beam lithography system employing an i-line or the like, and FIG. 5B is a schematic plan view showing a mask image fabricated using the mask data.

In the data image, a data (pattern data) 23 of a mask data 4 for forming a mask pattern is formed into an octagonal shape. The laser-beam lithography system has a not so high resolution, allowing for example a hexagonal pattern data having relatively lesser number of vertexes to obtain a photomask 5 having an aperture 24 closer to a circular shape (approximated circle).

Third Embodiment

Figure 6A:
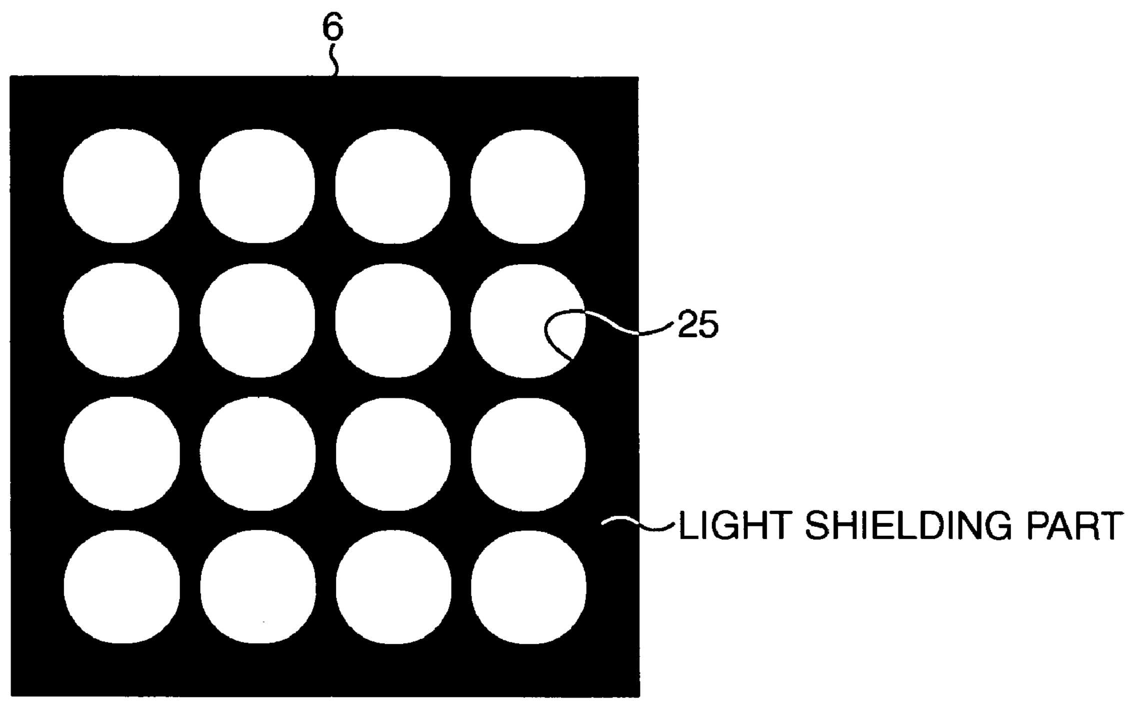
FIG. 6A is a schematic plan view showing an image of a photomask.
Figure 6B:
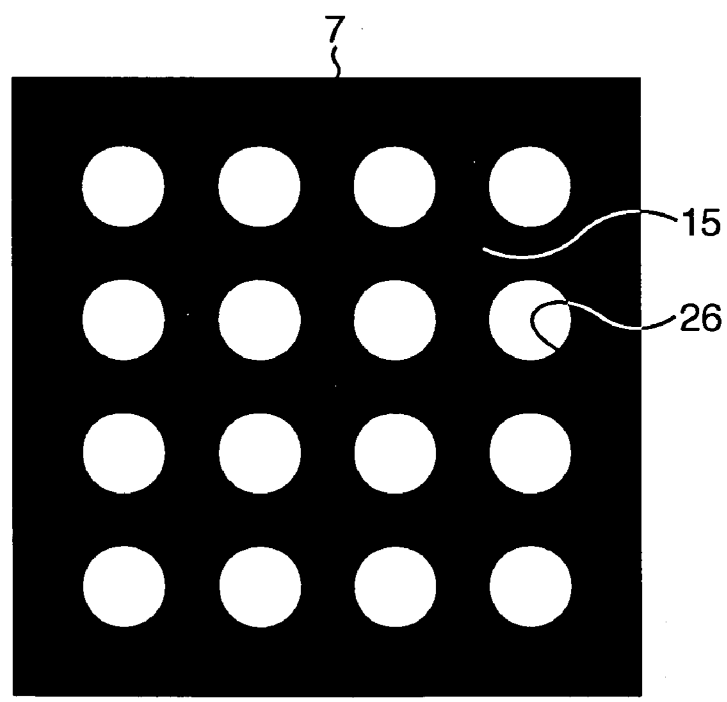
FIG. 6B is a schematic plan view showing an image of a resist pattern on a wafer formed using the photomask in FIG. 6A.

A third embodiment according to the present invention is shown in FIGS. 6A and 6B. In the third embodiment, an actual pattern for a contact hole is formed using a photomask having a mask pattern approximated to a circular shape. FIG. 6A is a schematic plan view showing an image of the photomask, and FIG. 6B is a schematic plan view showing the image of a resist pattern on a wafer formed using the photomask.

Here, an exposure was performed using a photomask 6 having mask patterns 25 arranged at pitches of 180 nm and each having a hole diameter of 100 nm under the illumination conditions of NA=0.7 and $\sigma$=⅔ zone. With the use of such a photomask 6 having the mask patterns 25 each of which is an aperture approximated to a circular shape, desired circular resist patterns 26 are formed in a resist 15 on a wafer 7, even if the resist does not open such apertures when using a normal square mask pattern.

Fourth Embodiment

Figure 7:
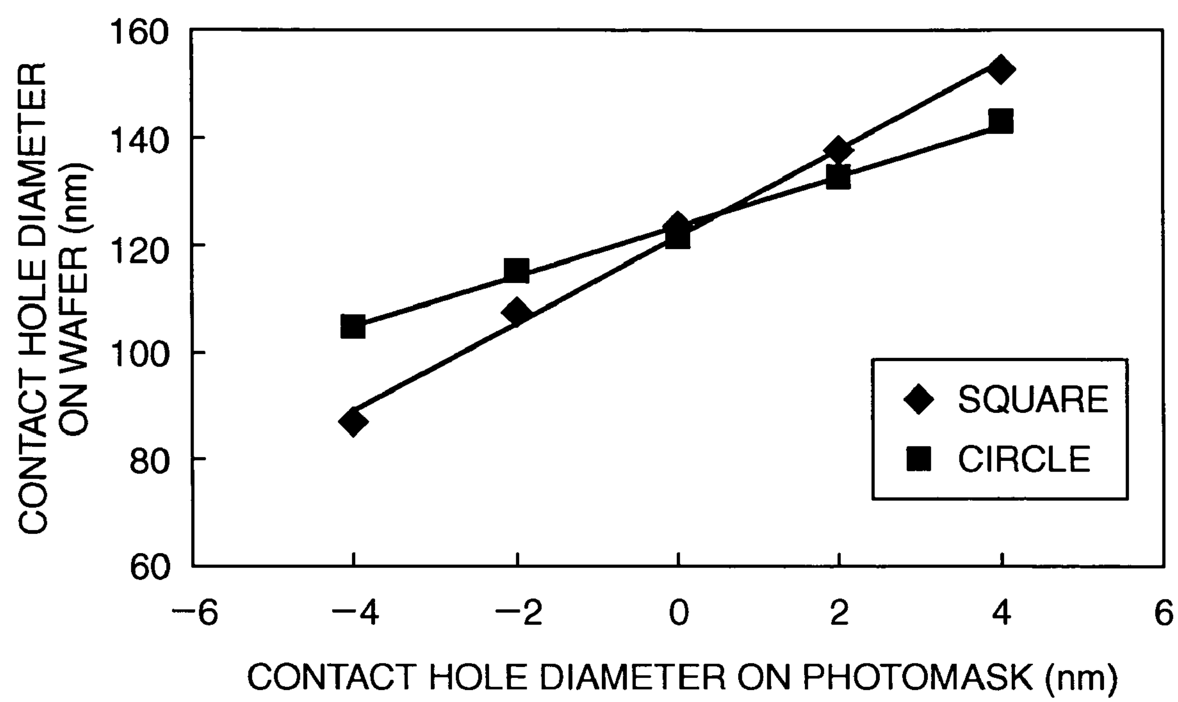
FIG. 7 is a characteristic chart showing a relation between a hole diameter of a mask pattern on a photomask and a hole diameter of a contact hole on a wafer.

A fourth embodiment of the present invention is shown in FIG. 7. FIG. 7 is a characteristic chart showing a relation between hole diameters of mask patterns on a photomask and hole diameters of contact holes on a wafer. The hole diameters of the mask patterns are shown in a horizontal axis, and the hole diameters of the contact holes are shown in a vertical axis, respectively.

Here, mask patterns arranged at pitches of 220 nm and each having a hole diameter of 120 nm are transferred onto the wafer by being exposed under the illumination conditions of NA=0.7 and $\sigma$=⅔ zone. In the comparison between the photomask having mask patterns in a square shape and the photomask having mask patterns approximated to a circular shape, there is a large difference in the gradients of straight lines showing the relation between the hole diameters of the mask patterns and the hole diameters of the contact holes. The result shows that the mask pattern approximated to a circular shape has a larger process margin.

Fifth Embodiment

Figure 8:
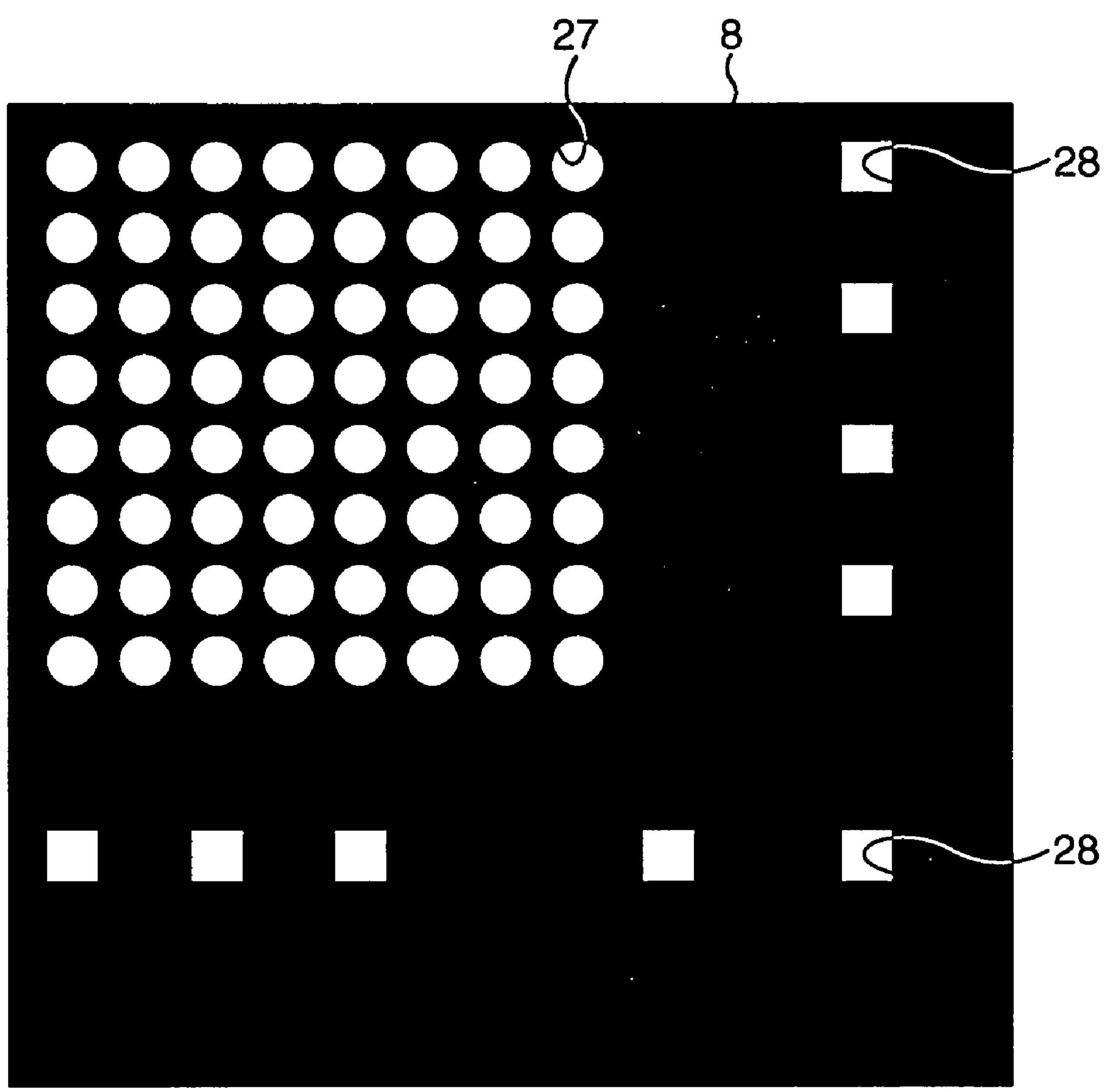
FIG. 8 is a schematic plan view showing an example in which mask patterns are changed in accordance with positions on a photomask.

A fifth embodiment according to the present invention is shown in FIG. 8. In the fifth embodiment, an example in which mask patterns vary in accordance with the position on a photomask is shown.

Here, on a photomask 8, mask patterns 27 which are arranged in smaller pitches are formed to approximate a circular shape, and mask patterns 28 arranged at relatively larger pitches are formed into a square shape. Specifically, this is a case where such mask patterns 27 that are approximated to a circular shape are adopted only for positions being difficult to form a mask pattern. With the use of such a technique, the mask data can be prevented from increasing unnecessarily.

Sixth Embodiment

Figure 9:
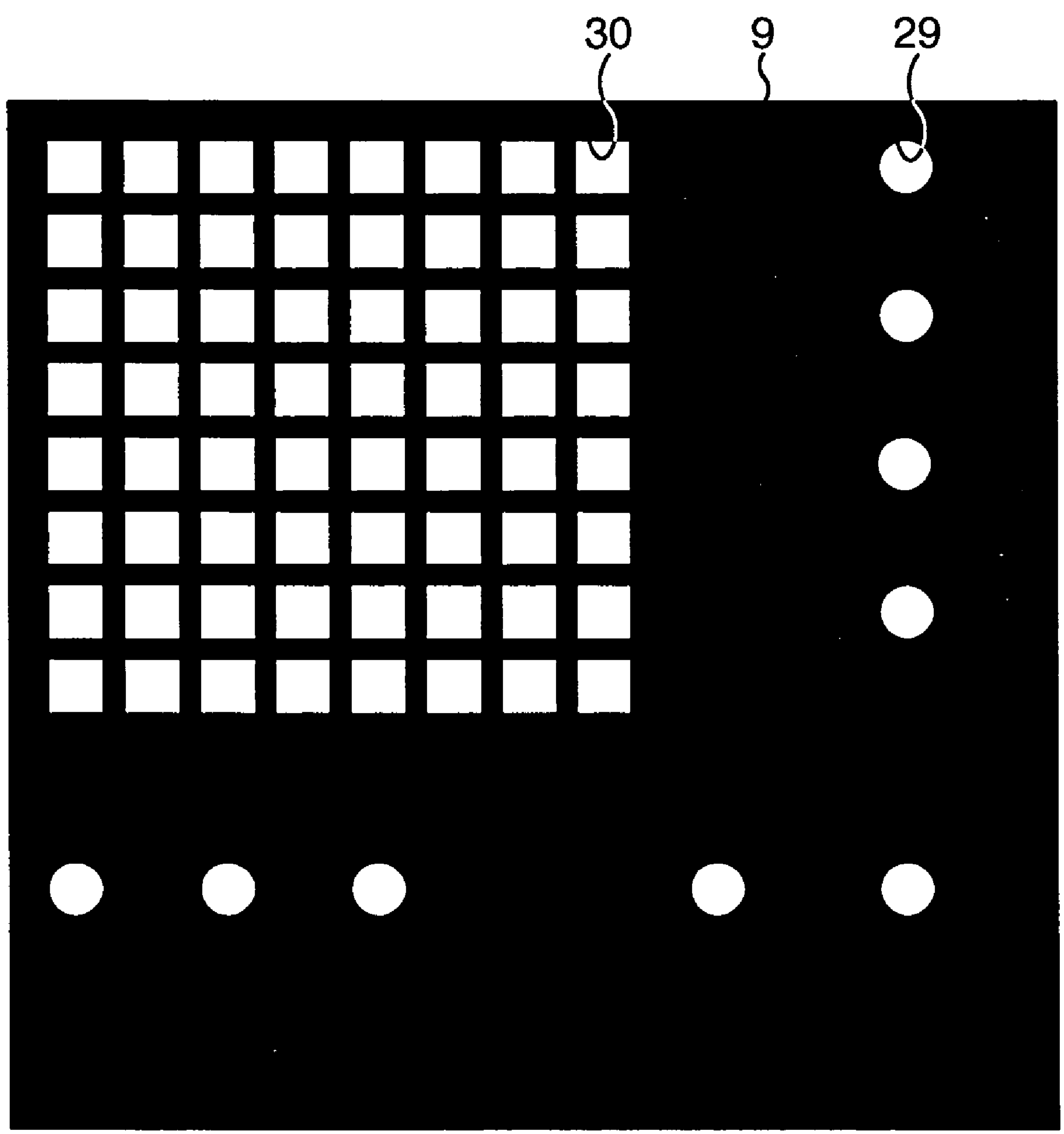
FIG. 9 is a schematic plan view showing an another example in which mask patterns are changed in accordance with positions on a photomask.

A sixth embodiment according to the present invention is shown in FIG. 9. In the sixth embodiment, the other example in which mask patterns vary in accordance with the position on a photomask is shown.

Here, only the mask patterns 29 arranged relatively at larger pitches are formed to approximate to a circular shape, and mask patterns 30 arranged at smaller pitches are formed into a square shape. This is the example being effective especially used when size stability is required for the mask patterns arrange at larger pitches. Approximation to a circular shape is adopted only for the mask patterns arranged at larger pitches, the data amount does not vary largely from a normal data amount.

Seventh Embodiment

Figure 10:
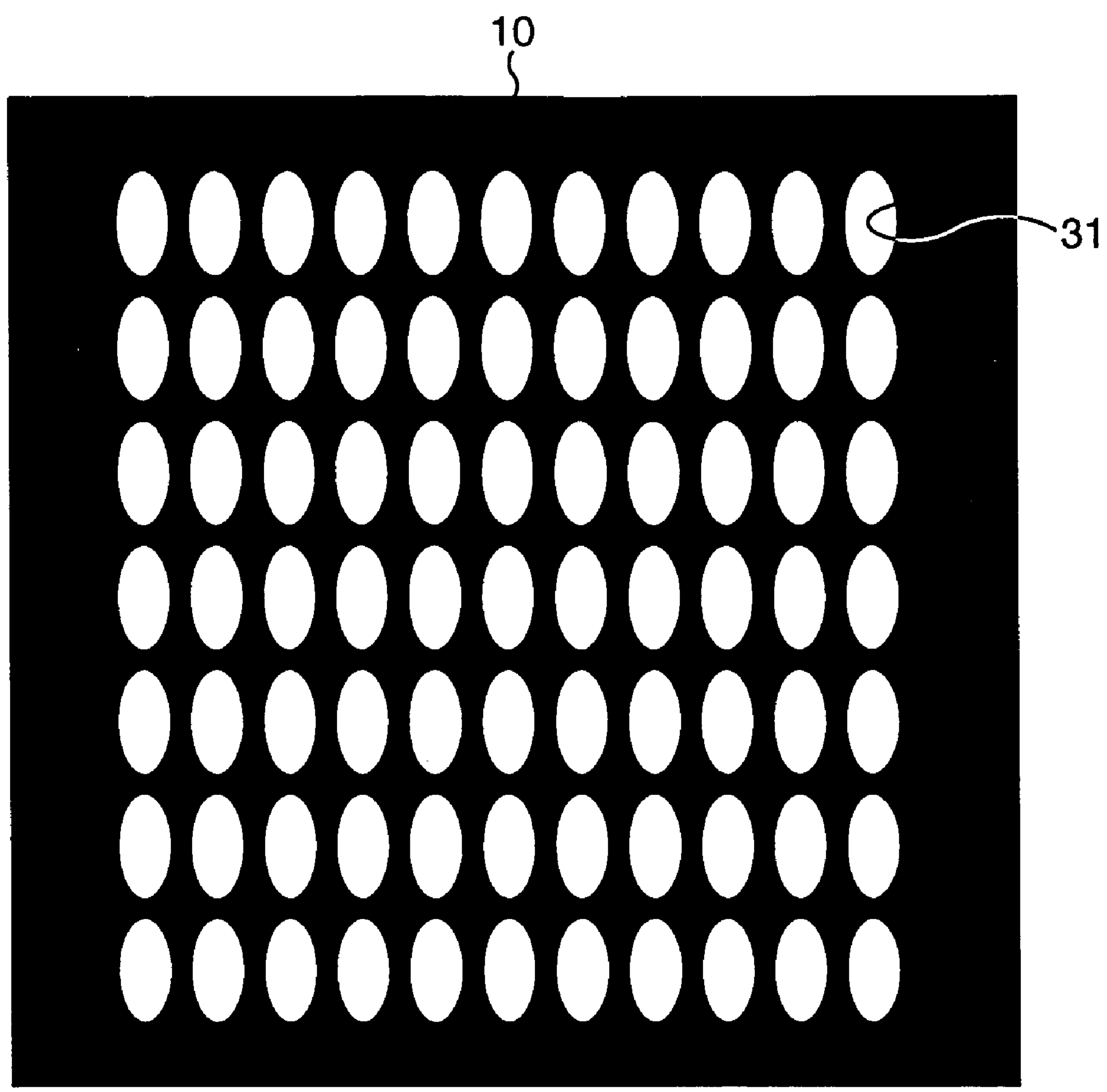
FIG. 10 is a schematic plan view showing a photomask when forming an actual pattern in accordance with a capacitor of a memory element.

A seventh embodiment according to the present invention is shown in FIG. 10. In the seventh embodiment, a photomask when forming an actual pattern corresponding for example to a capacitor of a memory element will be shown.

Here, a photomask 10 having mask patterns 31 each of which is approximated to an oval shape is used. In fabricating the photomask 10, by biasing, mask patterns arranged at smaller pitches can be obtained.

Eighth Embodiment

Figure 11A:
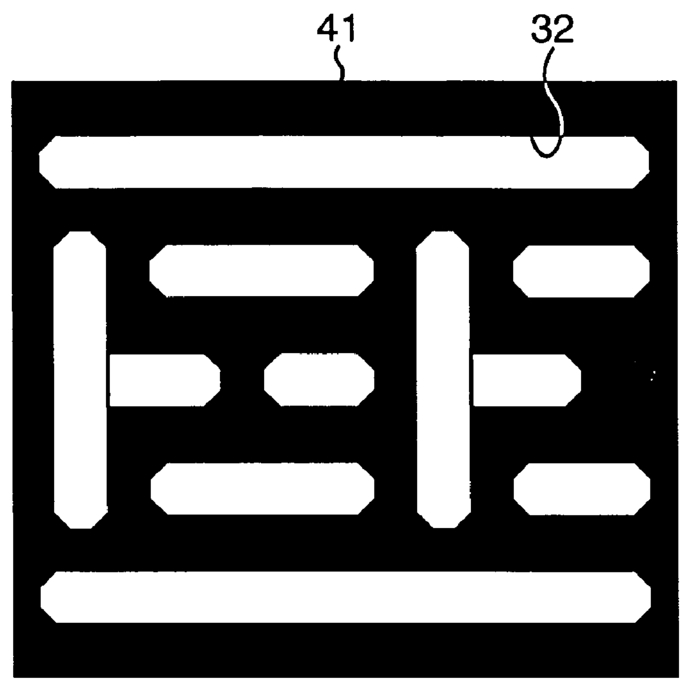
FIG. 11A is a schematic plan view showing a data image for fabricating a photomask.
Figure 11B:
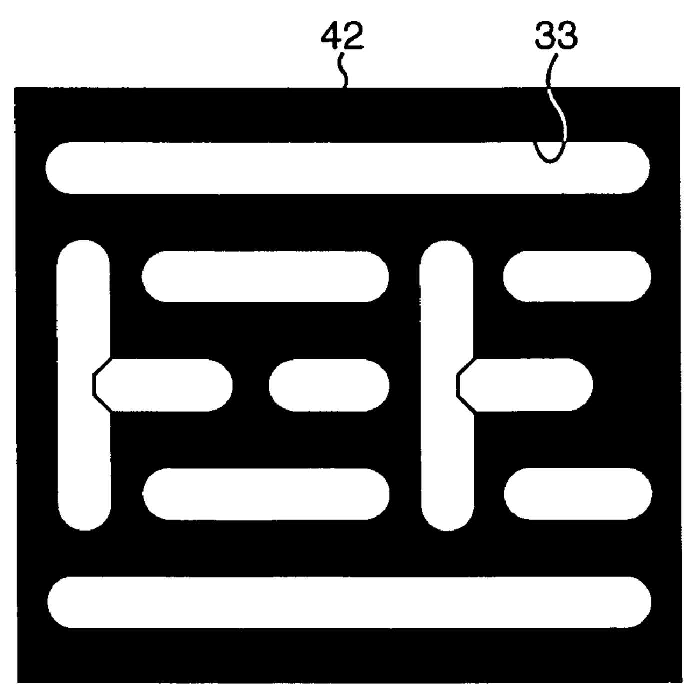
FIG. 11B is a schematic plan view showing a mask image fabricated using the mask data in FIG. 11A.

An eighth embodiment according to the present invention is shown in FIGS. 11A and 11B. In the eighth embodiment, for example, a photomask for forming, for example, an actual pattern such as of bulk wiring in a logic device will be fabricated. FIG. 11A is a schematic plan view showing a data image for fabricating the photomask, and FIG. 11B is a schematic plan view showing a mask image formed using the mask data.

Here, on a mask data 41, mask patterns 33 having an end portions that are approximated to a circular shape can be formed by approximating corner portions of respective pattern data 32 to a polygonal shape. With the use of such a mask pattern, a stable resist pattern having a large process margin can be obtained.

Ninth Embodiment

Figure 12A:
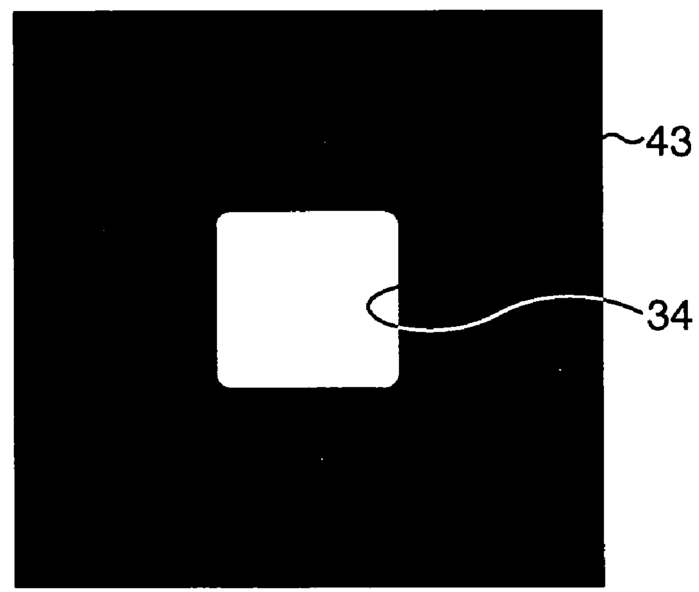
FIG. 12A is a schematic plan view showing an image of a photomask having a mask pattern of a square shape formed by the electron-beam lithography system.
Figure 12B:
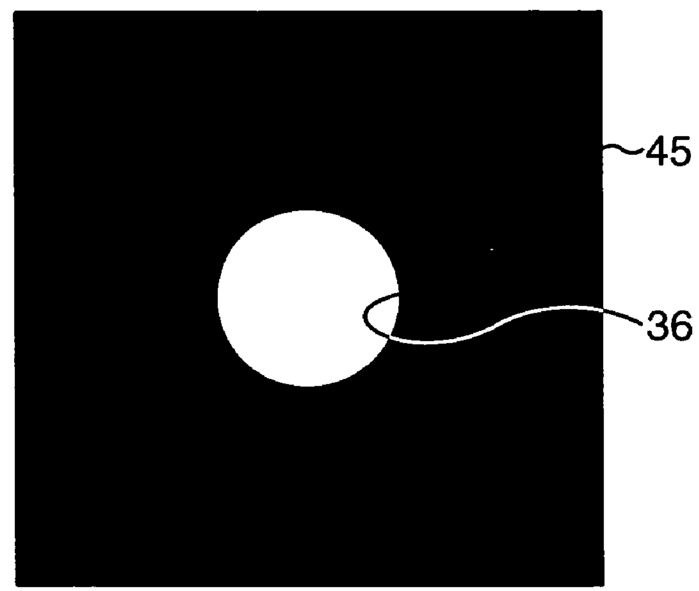
FIG. 12B is a schematic plan view showing an image of a photomask having a mask pattern approximated to a circular shape formed by the electron-beam lithography system.
Figure 13A:
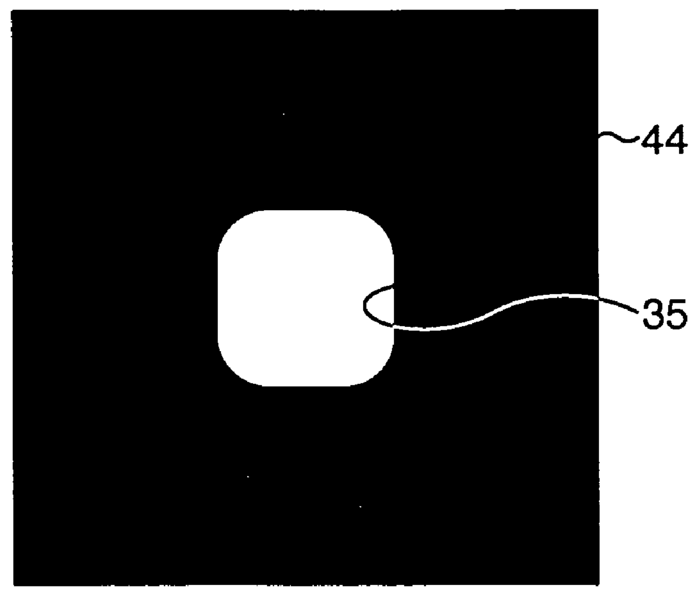
FIG. 13A is a schematic plan view showing an image of a photomask having a mask pattern of a square shape formed by the laser-beam lithography system.
Figure 13B:
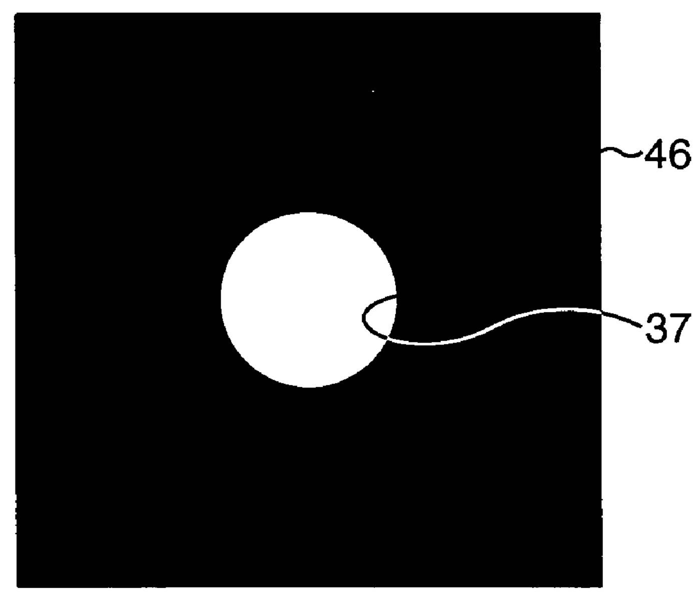
FIG. 13B is a schematic plan view showing an image of a photomask having a mask pattern approximated to a circular shape formed by the laser-beam lithography system.

A ninth embodiment according to the present invention is shown in FIGS. 12A, 12B, 13A, 13B. In the ninth embodiment, a comparison is made between the shapes of mask patterns formed by an electron-beam lithography system and a laser-beam lithography system, respectively. FIG. 12A is a schematic plan view showing a photomask having a square mask pattern formed by the electron-beam lithography system, FIG. 12B is a schematic plan view showing a photomask having a mask pattern approximated to a circular shape formed by the electron-beam lithography system, FIG. 13A is a schematic plan view showing a photomask having a square mask pattern formed by the laser-beam lithography system, and FIG. 13B is a schematic plan view showing a photomask having a mask pattern approximated to a circular shape formed by the laser-beam lithography system.

In the case of square mask patterns, there arises a difference in the shapes depending on the lithography system. Here, a mask pattern 35 of a photomask 44 has corner portions closer to a circle than those of mask pattern 34 of a photomask 43 shown in FIG. 12A. The difference in the shapes is reflected to the difference in optical proximity correction values. Meanwhile, in the case of the circular mask patterns, there arises no difference in the shapes of the patterns and the both patterns by the both lithography systems are approximated to a circular shape. Accordingly, a mask pattern 36 of a photomask 45 in FIG. 12B and a mask pattern 37 of a photomask 46 shown in FIG. 13B have substantially the same approximated circular shape. Hence, by letting the mask pattern for a contact hole have not a square shape but an approximated circular shape, the optical proximity correction value has no difference, so that the optical proximity correction value requires no change even if the mask manufacturing process is changed.

As has been described, it is found that, when a contact hole is formed using the mask pattern approximated to a circular or oval shape, it is possible to stably form the resist patterns arranged at smaller pitches. Further, when the mask pattern is of an approximated circular shape, it is possible to eliminate the factor ascribable to the mask process from the proximity effect.

It should be noted that a normal optical proximity correction is also applicable in conjunction with the above-described embodiments.

INDUSTRIAL APPLICABILITY

According to the present invention, it is possible to form resist patterns at small pitches without causing failures in manufacturing a device such as a reduction in resist film thickness, a disconnection between actual patterns such as of contact holes, and so forth; and it is also possible to eliminate the factor of the mask manufacturing process from the optical proximity correction, allowing the simplification of the optical proximity correction, so that desired micro actual patterns can be formed easily and accurately.

What is claimed is:

1. A manufacturing method of a photomask including a first mask pattern formed in a first portion and a second mask pattern formed in a second portion, comprising:

a first step creating a first design data of the first mask pattern and a second design data of the second mask pattern; and a second step forming the first mask pattern and the second mask pattern, based on the first design data and the second design data, wherein the first step comprises:

creating the first design data in the first portion by using line segments that form a polygon shape on a first outline part of the first mask pattern and creating the second design data in the second portion, by using line segments that form a square shape and have a fewer number of angles than the line segments that form the polygon shape, on a second outline part of the second mask pattern and wherein the second step comprises:

forming the first mask pattern where the first outline part is approximated to a curve, in the first portion; and forming the second mask pattern where the second outline part is approximated to a square shape, in the second portion.

2. The manufacturing method of the photomask according to claim 1, wherein an actual pattern formed by the first mask pattern is a circular shape or an oval shape, and wherein the first mask pattern is formed to approximate to the circular shape or the oval shape so as to correspond to the shape of the actual pattern formed by the first mask pattern.

3. The manufacturing method of the photomask according to claim 1, wherein an actual pattern formed by the first mask pattern has an outline with curved corners, and wherein the first mask pattern is formed to have an outline with curved corners being approximate to the curved corners of the actual pattern formed by the first mask pattern.

4. A photomask including a first mask pattern formed in a first portion and a second mask pattern formed in a second portion, wherein the first mask pattern is formed, so that a first design data of the first mask pattern is created by using line segments that form a polygon shape on a first outline part and the line segments that form the polygon shape are approximated to a curve based on the first design data, and wherein the second mask pattern is formed, so that a second design data of the second mask pattern is created by using line segments that form a square shape, and have fewer number of angles than the line segments that form a polygon shape, on a second outline part and the line segments that form the square shape are formed into the square shape based on the second design data.

5. The photomask according to claim 4, wherein an actual pattern formed by the first mask pattern is a circular shape or an oval shape and, wherein said first mask pattern is formed to approximate to the circular shape or the oval shape so as to correspond to the shape of the actual pattern formed by the first mask pattern.

6. The photomask according to claim 5, wherein the actual pattern formed by the first mask pattern has an outline with curved corners, and wherein said first mask pattern has an outline with approximated curved corners so as to correspond to the curved corners of the actual pattern.

7. A formation method of a pattern forming an actual pattern comprising:

forming the actual pattern by espousing and transferring a mask pattern using a photomask including a first mask pattern formed in a first portion and a second mask pattern formed in a second portion, wherein the photomask comprises:

the first mask pattern formed so that a first design data of the first mask pattern is created by using line segments that form a polygonal shape on a first outline part and first outline part is approximated to the curve based on the first design data; and the second mask pattern formed so that a second design data of the second mask pattern is created by using line segments that form a square shape, and have a fewer number of angles than the line segments that form the polygonal shape, on the second outline part and the second outline part is formed into the square shape based on the second design data.

8. The formation method of the pattern according to claim 7, wherein the actual pattern is a circular shape or an oval shape, and wherein the first mask pattern is formed to approximate to the circular shape or the oval shape so as to correspond to the shape of the actual pattern.

9. The formation method of the pattern according to claim 8, wherein the actual pattern has an outline with curved corners, and wherein the first mask pattern has an outline with curved corners approximated to the curved corners of the actual pattern to correspond to the shape of the actual pattern.

* * * * *